United States Patent [19]

Morrison, Jr.

[11] 4,312,731
[45] Jan. 26, 1982

[54] MAGNETICALLY ENHANCED SPUTTERING DEVICE AND METHOD

[75] Inventor: Charles F. Morrison, Jr., Boulder, Colo.

[73] Assignee: VAC-TEC Systems, Inc., Boulder, Colo.

[21] Appl. No.: 32,768

[22] Filed: Apr. 24, 1979

[51] Int. Cl.³ .............................................. C23C 15/00
[52] U.S. Cl. ................................. 204/192 R; 204/298
[58] Field of Search ............................. 204/192 R, 298

[56] References Cited

U.S. PATENT DOCUMENTS

| | | | |
|---|---|---|---|
| 3,878,085 | 4/1975 | Corbani | 204/298 |
| 3,956,093 | 5/1976 | McLeod | 204/192 R |
| 4,046,660 | 9/1977 | Fraser | 204/192 C |

OTHER PUBLICATIONS

J. L. Vossen, W. Kern., editors, Thin Film Processes, Academic Press, New York, 1978, pp. 76–83.

Primary Examiner—Delbert E. Gantz
Assistant Examiner—William Leader
Attorney, Agent, or Firm—Gerald J. Ferguson, Jr.; Joseph J. Baker

[57] ABSTRACT

A method and apparatus for establishing the magnetic field in a magnetically enhanced sputtering device wherein a predetermined plasma path is formed adjacent a layer of target material to be sputtered wherein a first component of the magnetic field is substantially perpendicular to the plasma path and a second component thereof is substantially parallel to the path. Various embodiments are described for generating the foregoing magnetic field components.

74 Claims, 15 Drawing Figures

FIG. 1A
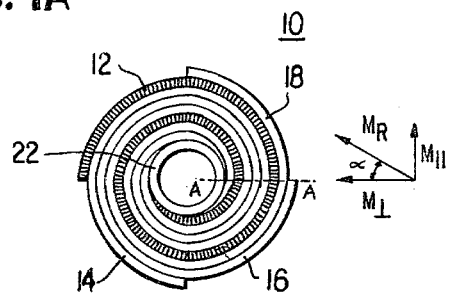
FIG. 1B
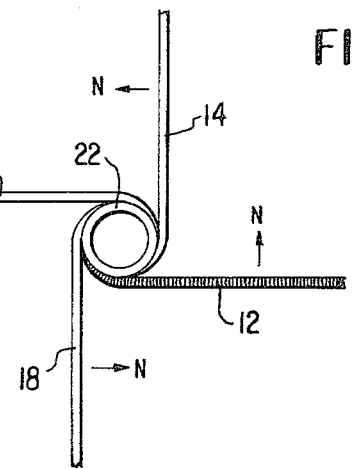
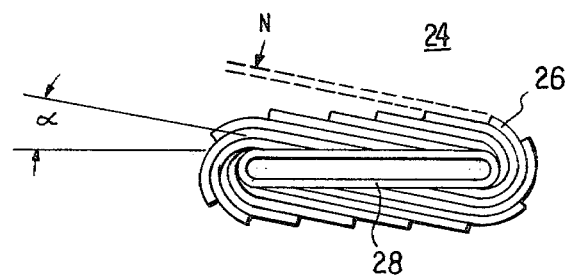
FIG. 2
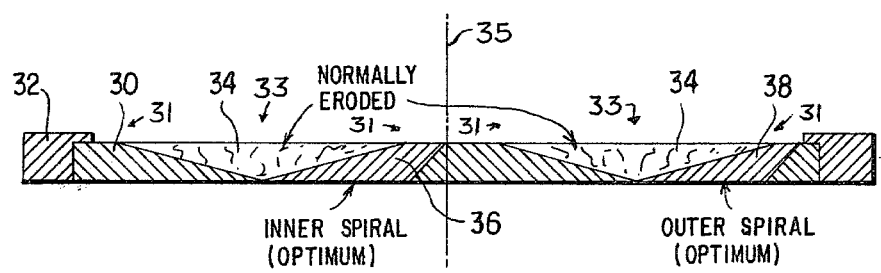
FIG. 3A    FIG. 3B
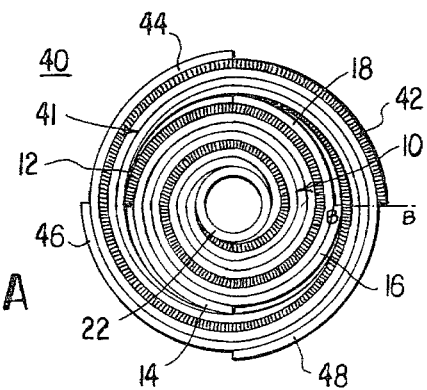
FIG. 4A

MAGNETICALLY ENHANCED SPUTTERING DEVICE AND METHOD

REFERENCE TO RELATED APPLICATIONS

This application is related to co-pending U.S. Application Ser. No. 19,284 filed Mar. 9, 1979, now U.S. Pat. No. 4,265,729 which is a continuation-in-part of U.S. Application Ser. No. 946,370 filed Sept. 27, 1978, now U.S. Pat. No. 4,180,450 which, in turn, is a continuation-in-part of co-pending U.S. application Ser. No. 935,358 filed Aug. 21, 1978, now U.S. Pat. No. 4,162,954 by the present applicant, Charles F. Morrison, Jr. All of the foregoing applications are incorporated herein by reference.

BACKGROUND OF THE INVENTION

This invention relates to magnetically enhanced sputtering devices and, in particular, to improved means for implementing the magnetic enhancement of such devices.

Generally, crossed magnetic and electric fields are established in such devices. The electric field extends between an anode (which may be the chamber wall) and a target, which is typically at cathode potential and in circuit with the anode, whereby electrons are removed from the target. The removed electrons ionize gas particles to thereby produce a plasma. The ions are accelerated to the target to dislodge atoms of the target material. The dislodged target material then typically deposits as a coating film on an object to be coated. In order to improve the sputtering rate at low gas pressures, the crossed magnetic field is provided to lengthen the path travelled by the removed electrons and thus enhance the ionizing efficiency of the electrons. In order to further improve the ionizing efficiency of the electrons, a closed loop plasma path is preferably established so that a Hall effect current circulates around the path.

The ionizing electrons tend to concentrate in the regions where the magnetic lines of force are parallel to the target surface. In prior art devices which employ a closed plasma loop, the region over which the magnetic lines of force are parallel to the target surface tends to be rather small thus promoting non-uniformity of target erosion and inhibiting the realization of higher sputter rates. This is illustrated in FIGS. 3A and 3B where the conventional erosion pattern tends to be V-shaped. Further, target utilization tends to be minimal in that a relatively small portion of the target is sputtered before the erosion breaks through the bottom destroying it.

The exact mechanisms for magnetically enhanced plasma generation and retention against cathode surfaces are not fully understood. However it has been observed that the sputter erosion of target areas relates rather positively with the intensity—thickness product of the plasma above them. The plasma will not under all conditions cause erosion beneath itself, but there will certainly be no erosion where there has been no plasma. Progressing from gentle glow discharges toward intense plasmas, the plasma pattern widens but the intensity thereof tends to centralize. The resulting erosion track tends to be V-shaped as indicated in FIGS. 3A and 3B. Using a magnetic field source disposed beneath the target, this can be flattened somewhat in the bottom by shaping the magnetic field lines over the track to thereby inhibit somewhat the centralizing tendency in the plasma. When it is realized the track may be a loop on a planar target surface and the magnetic field must reverse polarity at the center and outer edges, there is little room to achieve such magnetic reversals at significant gauss levels and to also provide the desired degrees of field shaping. Thus, when the magnetic field source is disposed beneath the target, it is difficult to fully flatten the lines of force to encourage plasma spread.

It is thought the plasma exists primarily where effective trapping of ionizing electrons has been provided or if they have not been trapped, they have at least been provided in significant density. When the plasma forms, its nearly equal numbers of electron and positive ions provide a low impedance region that minimizes the voltage gradient through it. This decreased gradient reduces the electrostatic forces that would scatter the electrons, making for greater plasma density. The increased density further lowers the electrostatic scattering. Thus the plasma formation is a positive feedback phenomenon. Hence, there is little flexibility available in prior art approaches, such as those discussed with respect to FIGS. 1 and 3 of aforementioned application Ser. No. 935,358, to lessen the tendency for the undesired V-shaped erosion of the target.

SUMMARY OF THE INVENTION

It is thus a primary object of this invention to provide an improved magnetron sputtering device wherein the plasma intensity tends to be uniformly spread over a substantial portion of the target surface.

It is a further object of this invention to provide a device of the above type wherein the magnetic field thereof is generated in such a manner as to uniformly spread the plasma intensity.

It is a further object of this invention to provide various embodiments for implementing the foregoing advantageous results.

Other objects and advantages of this invention will be apparent from a reading of the following specification and claims taken with the drawing.

BRIEF DESCRIPTION OF THE DRAWING

FIG. 1A is a plan view of a first illustrative embodiment of a magnetic field source in accordance with the invention.

FIG. 1B illustrates a method for fabricating the magnetic field source of FIG. 1A.

FIG. 2 is a plan view of an illustrative oval-shaped magnetic field source corresponding to the FIG. 1 embodiment.

FIGS. 3A and 3B are cross-sectional views of targets illustrating enhancement of the erosion patterns thereof in accordance with the invention.

FIG. 4A is a plan view of a further illustrative magnetic field source in accordance with the invention.

DETAILED DESCRIPTION OF THE PREFERRED EMBODIMENTS OF THE INVENTION

Figure 4B:
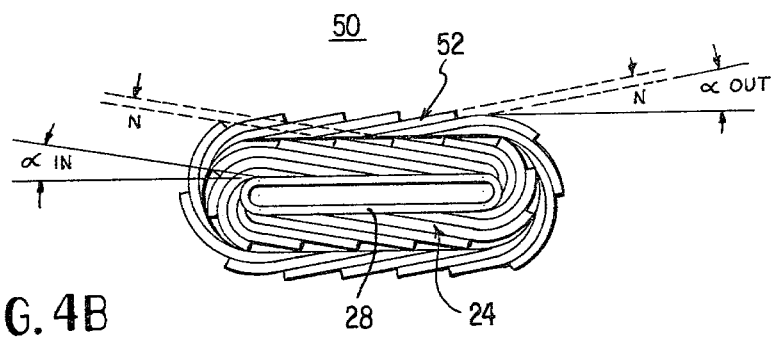
FIG. 4B is a plan view of an illustrative, oval-shaped source corresponding to the FIG. 4A embodiment.

Reference should be made to the drawing where like reference numerals refer to like parts.

FIGS. 1A and 1B are directed to a first embodiment of the invention for establishing a plasma path where at least some of the plasma tends to spiral inwardly. In FIG. 1A, there is shown a plan view of a magnetic field source 10. This source is typically disposed beneath a planar target 30 such as that shown in FIG. 3A, the respective planes of magnet 10 and target 30 being generally parallel with respect to one another as is known in this art. The resultant magnetic field established by source 10 above target 30 along the line A—A will correspond to $M_R$ as indicated in FIG. 1A. The inclination of $M_R$ with respect to a line A—A is the angle $\alpha$ where line A—A corresponds to a radial drawn from the center of source 10. The resultant magnetic field $M_R$ has two components designated as $M_\perp$ and $M_\parallel$. The $M_\perp$ component is substantially parallel to the line A—A, the direction of this component being the same as that of the magnetic field which is conventionally generated in known sputter magnetron devices. Such devices are illustrated in FIGS. 1 and 3 of aforementioned application Ser. No. 935,358. This conventional magnetic field is crossed with respect to the electric field, which is typically perpendicular to the target surface. Due to the crossing of the electric and magnetic fields and the closed loop arrangement of the magnetic field source, a closed loop plasma path is established over the target surface. Thus, in FIG. 1A, if $M_\perp$ were the only magnetic field component present, the plasma path would be circular and concentrically disposed with respect to the center of source 10. As can be seen in FIG. 3A, the resulting erosion track 34 tends to be V-shaped—that is, with intense plasmas, a plasma surplus tends to occur in the central portion of the closed loop plasma path, the sides of the path approximately occurring at 31 and the central portion at 33. It is to be understood that FIGS. 3A and 3B are respective cross-sectional views of conventional planar targets such as those described in aforementioned application Ser. No. 935,358 where FIG. 3A illustrates one-half of a target 30 which is symmetrically disposed about center line 35 and FIG. 3B illustrates one-half of a target 30a which is also symmetrically disposed about center line 35. In particular, FIG. 3A illustrates how the erosion pattern may be inwardly broadened in accordance with the present invention as indicated by cross-hatched portion 36 while FIG. 3B illustrates how the erosion pattern may be outwardly broadened as indicated by cross-hatched portion 38. Clamp 32 is provided to hold the targets in place.

Broadening of the erosion pattern is effected by the provision of $M_\parallel$, which causes plasma to be removed from the surplus at the central portion of the path. Thus, with the embodiment of FIG. 1A, the V-shaped erosion pattern tends to be modified in accordance with the cross-hatched portion 36 shown in FIG. 3A. By flattening the bottom of the central portion of the erosion pattern in this manner, increased target utilization results in that more of the target is sputtered away before the deepest part of the erosion breaks through the bottom of the target destroying it.

From the foregoing, it should be understood $M_\perp$ is perpendicular to the closed loop plasma path which $M_\perp$ produces, this path being typically concentrically disposed about the center of source 10 while $M_\parallel$ is parallel to this plasma path. In FIG. 1A, due to the direction of $M_\parallel$ with respect to the electric field, the plasma is removed from the surplus in the center of the path toward the center of target 30. The plasma is thus under the influence of not only $M_\perp$ but also $M_\parallel$. Hence, generally speaking, the electric field is twice crossed by magnetic fields—(that is, once by $M_\perp$ and once by $M_\parallel$) to broaden the plasma intensity with respect to the target surface.

Referring to FIG. 1B, there is illustrated a method of fabricating magnetic field source 10 of FIG. 1A. Flexible magnets 12-18 are wound upon a mandrel 22, which may or may not be made of a magnetic material. The flexible magnets typically each comprise oriented ferrite impregnated plastic or rubber tapes such as those sold under the designation PL-1.4H by the Minnesota Mining and Manufacturing Co. The magnetic flux direction within each of the tapes is perpendicular with respect to the length thereof as indicated in FIG. 1B. The end 20 of each tape is provided by grinding, for example, with an $\alpha°$ taper where $\alpha$ is the angle between $M_R$ and $M_\perp$. The respective ends thereof are then attached by glueing, for example, to mandrel 24, each attached end typically extending over one-quarter of the circumference of the mandrel. If more or less tapes are used, the attached ends will extend over a portion of the circumference determined by the number of tapes employed. Thus, if six tapes were used, each tape would extend over one-sixth of the mandrel circumference. The tapes are then wound around mandrel 22 to thereby fabricate magnetic field source 10 of FIG. 1A, where tape 12 is lined for purposes of illustration.

In both FIGS. 1A and 1B, an edge view of the tapes is illustrated. However, it is to be understood that the view of the tapes in these Figures could also be a plan view thereof. It should be noted that since the tapes 12-18 have a constant thickness subsequent to the tapered portion thereof, $\alpha$ will not be constant but will gradually decrease along a radial from the center of source 10. If it is desired to make $\alpha$ constant, tapes 12-18 should appropriately increase in thickness with distance from the source center. However, $\alpha$ need not be constant to achieve the desired results of this invention. Further, if tapes 12-18 are the same length, and resulting source 10 will approach an $\alpha=0$ structure on the outside thereof, assuming the lengths of the strips are sufficiently long.

As discussed above, the erosion pattern of FIG. 3A tends to be V-shaped if only the field component $M_\perp$ perpendicular to the closed loop plasma path is employed. Because of $M_\parallel$ parallel to this path, the cross-hatched portion 36 results due to plasma being removed from the surplus over the center of the V. That is, since voltage is available at all points on the cathode, it is only necessary to force the plasma density to be uniform over portion 36 to achieve sputtering thereat. By providing $M_\parallel$, an apparatus and method is effected which continuously removes electrons from the plasma surplus into areas such as that over portion 36 which would otherwise have little or no sputtering. Because the electrons are not effectively trapped over portion 36, continuous removal of the electrons from the surplus may be advantageous and is effected by $M_\parallel$.

There is a significant increase in electron emission from portion 36 as it sputters; hence, the inflow of electrons need not be extremely large to significantly enhance uniformity of the target utilization. Thus, the magnitude of $M_{\parallel}$ may be and preferably is smaller than that of $M_{\perp}$. As can be appreciated, $\alpha$ will be less than 45° when $M_{\parallel}$ is less than $M_{\perp}$. Generally, $\alpha$ may be 3°-80° while a preferred range therefor is 5°-30° although it is to be understood that there is no intent to be limited to a particular value of or range for $\alpha$. In aforementioned co-pending U.S. patent application Ser. No. 935,358, there is disclosed a spiral wound flexible magnetic field source where the value of $\alpha$ would tend to be 1° or 2°. Although it is the intent of the present invention to include such small values of $\alpha$, these values tend to be impractical in that $M_{\parallel}$ is not large enough to provide significant removal of electrons from the plasma surplus at the central portion of the plasma path.

In FIG. 2, there is illustrated an oval-shaped magnetic field source 24 corresponding to circular source 10 of FIG. 1 where the ends of each tape 26 are provided with an $\alpha°$ taper and attached to mandrel 28. As indicated by the dotted line extension of one of the tapes, the field direction within each tape is inwardly directed whereby the plasma tends to spiral inwardly. In other words, the primary plasma loop path corresponds to the oval configuration of source 24 and plasma is inwardly removed from the surplus in the center of the primary path to thereby render more uniform erosion of the central portion of the target as indicated by portion 36 of FIG. 3A.

An inwardly directed plasma flows component is produced by the spiral-in magnetic field sources of FIGS. 1A and 2. In order to produce an outwardly directed plasma flow, the magnetic field source 40 of FIG. 4A may be employed. In this embodiment, tapes 42-48 are provided with $\alpha°$ tapers at the inner ends thereof and wound around tapes 12-18 where tapes 42-48 are outwardly wound in contradistinction to the inward winding of tapes 12-18 where tape 42 is lined for purposes of illustration. Hence, as shown in the diagram in FIG. 4A, the angle $\alpha$ is negative along the line B—B while it is positive along the line A—A as indicated in FIG. 1A. In particular $M_{\perp}$ is in the same direction along A—A and B—B while $M_{\parallel}$ is in a first direction parallel to the plasma path along A—A and in the opposite direction parallel to the path along B—B. Accordingly, in this embodiment, the electric field is crossed by three different magnetic field components—that is, $M_{\parallel}$ along A—A, $M_{\parallel}$ (reversed 180°) along B—B and $M_{\perp}$ (in the same direction) along both A—A and B—B. Hence, generally speaking, the various embodiments of this invention may be considered polycrossed field sputter devices.

In FIG. 4A, plasma is outwardly removed from the surplus at the center of the plasma path along the line B—B to thereby flatten the target erosion pattern as indicated in cross-hatched portion 38 of FIG. 3B. By combining both inward and outward removal of electrons from the centrally disposed surplus, the combined effects of FIGS. 3A and 3B may be achieved by source 40 of FIG. 4A. FIG. 4B corresponds to FIG. 4A where there is shown an oval-shaped magnetic field source 50 having an outwardly wound source 52 disposed around inwardly wound source 24 of FIG. 2.

Figure 5A:
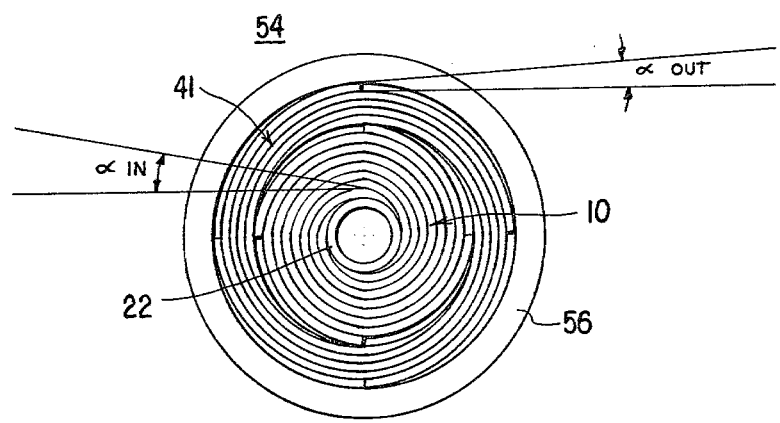
FIG. 5A is a combined plan and cross-sectional view of a further illustrative embodiment in accordance with the invention.
Figure 5B:
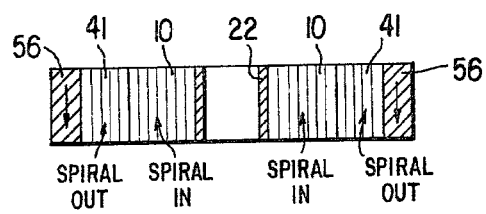
FIG. 5B is a plan view of an illustrative, oval-shaped source corresponding to the FIG. 5A embodiment.
Figure 5B:
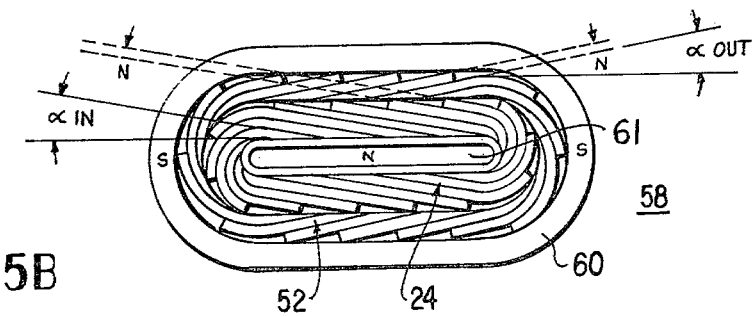

Referring to FIGS. 5A and 5B there are shown magnetic field sources 54 and 58 which respectively correspond to sources 40 and 50 of FIGS. 4A and 4B. In FIG. 5A, source 54 includes an outer ring magnet 56 which may comprise a stack of oriented ferrite impregnated tapes of the type described hereinbefore and as also described in the aforementioned co-pending patent applications. The ring magnet 56 is typically disposed beyond the perimeter of target 30 although it may be disposed beneath or within the target perimeter if so desired. As indicated in the cross-section of source 54, the magnet ring 56 is preferably in the same general plane as source 40. The purpose of ring 56 is to positively restrict outward electron plasma drift. As indicated hereinbefore, $M_{\parallel}$ of FIG. 4A will tend to continuously remove electrons from the centrally disposed plasma surplus toward the outer periphery of the target. In the absence of ring 56, the removed electrons would be readily lost. However, due to the perpendicular magnetic field component established at the periphery of source 54 by ring 56, the removed electrons are substantially prevented from moving past this perpendicular field. That is, the electrons tend to move along the magnetic lines of force. However, when they reach the perpendicular lines at the source periphery, they tend to move toward the source. However, the source is typically maintained at or near cathode potential and thus, the electrons are repelled from the source at the periphery thereof. Hence, the electrons removed from the centrally disposed plasma surplus tend to be trapped at the outer periphery of the target. The magnetic source 58 of FIG. 5B corresponds to source 54 of FIG. 5A where in particular ring magnet 60 corresponds to ring magnet 56. Also note in FIG. 5B, a central magnet 61 may also be employed to enhance entrapment of the electrons over the inner portion of the target.

Figure 6:
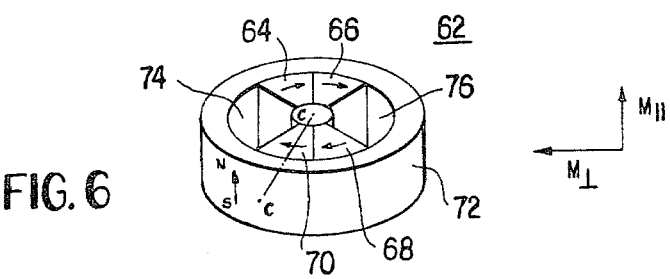
FIG. 6 is a perspective view of a further illustrative embodiment of the invention.

In the embodiments of FIGS. 1A-5B, the resultant magnetic field $M_R$ is directly generated by the spiral tape configurations illustrated in these Figures. The components $M_{\perp}$ and $M_{\parallel}$ occur due to the generation of $M_R$. Reference should now be made to FIG. 6 where the components $M_{\perp}$ and $M_{\parallel}$ are directly generated by different magnet sources rather than as components of a directly generated $M_R$. In particular, magnetic source 62 comprises magnets 64-70 which produce $M_{\parallel}$ and ring magnet 72 which produces $M_{\perp}$ along line C—C. Air gaps 74 and 76 which may be filled with appropriate material of a non-magnetic nature are also employed. Without the presence of ring magnet 72, $\alpha$ would be equal to 90° and the ionizing electrons would be lost. However, by providing $M_{\perp}$ with magnet 72, the electrons are caught before they can leave the cathode and remain in the peripheral areas of the plasma. The net effect of combining the fields produced by the parallel field $M_{\parallel}$ and perpendicular field $M_{\perp}$ magnets is the same as if the resultant magnetic field $M_R$ had been directly generated in accordance with the embodiments of FIGS. 1A-5B. With the parallel field $M_{\parallel}$ as shown in FIG. 6, plasma flow may be inward. If the direction of the flux in magnets 64-70 is reversed, the plasma flow then would be outward.

The gaps 74 and 76 are necessary if meaningful flux is to be projected above source 62 and thus above target 30. Otherwise, if gaps 74 and 76 contained magnets corresponding to magnets 64-70, the flux path would be almost totally within the magnets 64-70 and those in gaps 74 and 76—an effect similar to that of a closed loop solenoid. Since as much of the field should be projected above source 62 and target 30 as possible, it is thus undesirable to incorporate in gaps 74 and 76 magnets corresponding to magnets 64-70. By providing occasional gaps between the magnets, some field projection is provided above the magnets, this being indicated in FIG. 7A where magnets 78 and 80 may, for example, correspond to magnets 64 and 66 to thereby provide a single radially oriented magnet, the flux in which is perpendicular to the radial orientation of the magnet. Another such radially oriented magnet may be comprised of strips 82 and 84 and other such magnets are indicated by partial strips 76 and 86 where these magnets typically extend along radials from the center of the FIG. 6 structure although they may also be incorporated in an oval structure or the like. Alternating gaps 88, 90 and 92 between the magnets provide projection of the field above the magnets.

Figures 7A, 7B, 7C:
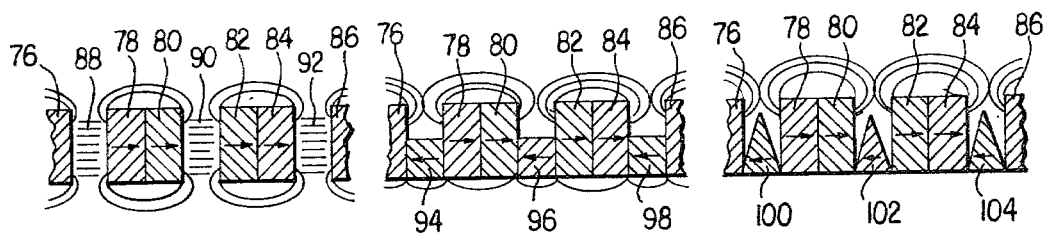
FIGS. 7A–7C are cross-sectional views of illustrative radially oriented magnet structures for use in the embodiment of FIG. 6.

In order to further enhance the projections of the field above the magnets of FIG. 7A, bucking magnets 94–98 may be disposed in lower portions of the respective gaps as illustrated in FIG. 7B where the direction of flux in the bucking magnets is opposite to that in the primary magnets comprised by strips 76–86. The effect of the bucking magnets is to substantially reduce the number of lines of force extending directly between the upper portion of the opposing faces of strips 76 and 78, strips 80 and 82, etc. and to project these lines of force above the target surface. Thus, a magnetic bridge is in effect established by the placement of magnets 94–98 in gaps 88–92 to thereby substantially null the lines of force passing between the upper portions of the opposing magnet faces. The magnetic bridge nulling effect substantially increases the flux level above the magnets, especially at greater distances. Further, the continuity of the field around the ring structure of FIG. 6 is enhanced, there being typically an order of magnitude difference with respect to the open gap embodiment of FIG. 7A. It should be noted that if the magnetic bridge were totally balanced by making the bucking magnets as tall as magnets 76–86, an alternating direction field would be generated which is not desired in the FIG. 6 embodiment. In FIG. 7B the bucking magnets are thus typically about one-half as tall as magnets 76–86 although the height may be varied to enhance projection of the field.

In FIG. 7C triangular blocking magnets 100–104 achieve the nulling effect from the entire end faces of magnets 76–86 but at the expense of greater complexity.

Figures 8A, 8B:
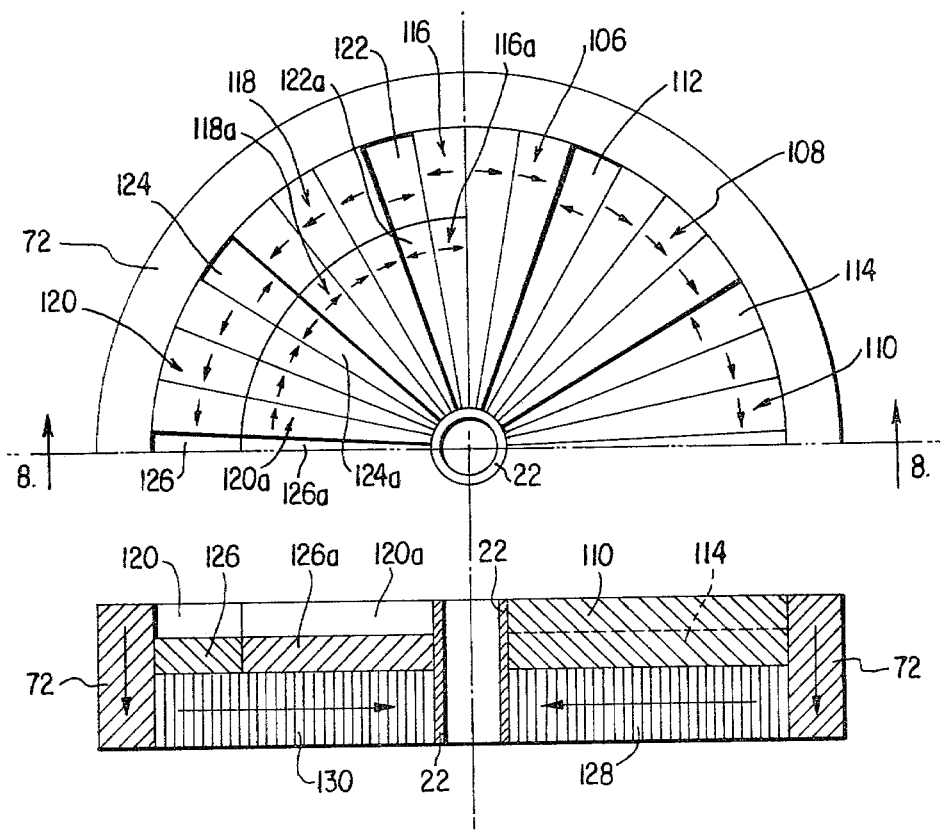
FIG. 8A is a combined plan and cross-sectional view of a further illustrative embodiment of the invention.
FIG. 8B is a combined plan and cross-sectional view of yet another illustrative embodiment of the invention.

Reference should now be made to FIG. 8A. In this Figure, magnets 106–110 generally correspond to magnets 76–86 of FIG. 7B while magnets 112 and 114 correspond to magnets 94 and 98, it being understood that the illustrated plan view of FIG. 8A corresponds to one-quarter of a FIG. 6 type structure. As indicated in the cross-section of this structure, the magnets 106 and 110 and 112 and 114 may be decreased in heighth to accommodate a magnet 128 disposed beneath the foregoing magnets. The magnet 128 provides a strong $M_\perp$ field above the $M_\parallel$ field produced by magnets 106–114 where magnet 128 may comprise a coil-like stack of oriented ferrite impregnated plastic tapes as described with respect to FIG. 5 of aforementioned application Ser. No. 935,358. In the embodiment of FIG. 8A, plasma electrons are inwardly removed from the centrally disposed surplus plasma. In the embodiment of FIG. 8B, plasma electrons are removed both inwardly and outwardly from the plasma surplus to provide the combined effects of FIGS. 3A and 3B. Thus, magnets 116–126 remove the plasma outwardly while magnets 116a–126a inwardly remove electrons. Magnet 130 corresponds to magnet 128 and hence, uniform sputtering of target 30 is enhanced.

Ring-type magnetic field sources of the general type shown in FIG. 6 may provide only very narrow and sharply peaked $M_\parallel$ fields and thus very little magnetically enhanced performance. It does not even appear possible to generate plasmas with power supplies which provide peak voltages of about 1000 volts or less at pressures of a few microns. However, when either a spiral-in or spiral-out center of the type shown in FIGS. 1A–5B is added, plasmas are easily generated, even at pressures less than one micron. There is no meaningful change in the parallel field $M_\parallel$. This expedient can therefore bridge the gap between effective and ineffective techniques in addition to its role of spreading the plasma. This does not imply different mechanism, it merely indicates that spreading the resultant field was the need for effective plasma retention in this case.

As can be appreciated from the embodiments of FIGS. 1A–5B, the embodiments of FIGS. 6–8 can also be readily extended to oval or rectangular cathode shapes. Further, although the field generated by magnets 64–70 of FIG. 6 is along the line of $M_\parallel$, it is to be understood that the field produced by such magnets may be in other directions and yet yield a desired resultant field $M_R$ where, as indicated hereinbefore, α may extend between ±3° through ±80° and preferably ±5° through ±30°. Because the need is for only a resultant $M_R$, not necessarily a simple, direct field, layers of magnets at different strengths and angles may be employed to achieve the desired effect.

The magnetic fields of the present invention are preferably obtained with ferrite magnets such as those described hereinbefore where the rubber or plastic tapes impregnated with oriented ferrite particles are particularly advantageous. The presence of these particles, which are capable of producing a very strong magnetic field, in a low permeability binder such as rubber or plastic, is apparently effective in generating fields having the requisite characteristics. Further, the oriented ferrite impregnated plastics make practical multipart magnet systems in which there is no need for interconnecting high permeability connections. In fact, such items as steel interconnecting plates sometimes detract from the flux levels obtained.

Many of the embodiments of this invention may use ferrite magnets in whole or in part such as those ferrite magnets made by Arnold Magnetics, Inc. or Crucible Iron and Steel Co. Also, many of the embodiments described herein may use more conventional magnets such as alnico ferromagnetic magnets in whole or in part but seldom with the convenience and practicality of the preferred materials. Electromagnets may also be employed, but they also are subject to the same objection. In any event, the above magnet means such as permanent magnets or electromagnets are preferably used in the subject application although magnetic means such as pole plates may also be used in some instances.

The magnetic structures of the present invention may be employed with planar cathodes which are circular or oblong. Oblong cathodes may be rectangular, elliptical or oval. Also, the planar cathode may be annular. Further, the planar cathode may include non-linear portions such as the concave portions shown in the cathodes of FIGS. 5 and 7 of U.S. Pat. No. 3,878,085. In addition to planar cathodes, cylindrical, conical, endless belt, etc. cathodes may also be employed. Also, as the cathode is sputtered, there may be a tendency for it to erode unevenly. Nevertheless, the cathode may still be considered planar, cylindrical or whatever its original shape was. Further, contoured surfaces may be imparted to the cathode so that it is thicker in areas of greatest expected erosion whereby the target will sputter relatively uniformly. Again, such a cathode is to be considered planar, cylindrical, etc. depending upon its general configuration prior to sputtering thereof.

The target material to be sputtered may or may not be the cathode of the device. If not, it may be clamped to the cathode by a clamp similar to those illustrated in FIGS. 3A and 3B where the clamp may also be employed to secure the cathode within the sputtering device. Further, the lines of force produced by the various magnetic field sources of this invention may or may not intersect the target surface. Also, although the magnetic field sources of this invention are typically disposed beneath planar targets, other relative locations may also be employed not only with planar targets but with the other target configurations mentioned above.

As is known, anodes are also utilized in sputter magnetron devices. The anode is usually so-called because sputtering systems are typically self-rectifying when an AC potential is applied. Hence, it is to be understood that the anode may be any other equivalent electrode in the system. Further, the anode can be the container wall of the sputtering device. DC, low frequency AC (60 Hz, for example) or industrial radio frequencies, such as 13.56 MHz or 27.12 MHz, may be applied across the anode and cathode. To effect RF isolation, the anode is almost always the container wall when these high frequencies are employed although it is quite often employed as the anode when DC is employed.

As to the gas employed in the system, it may be either active or inert depending upon the type of sputtered layer desired. It should be further noted that the principles of the present invention can be applied to sputter etching.

What is claimed is:

1. A magnetically enhanced sputter apparatus wherein at least a closed loop portion of a plasma path is formed adjacent a layer of target material having a sputtering surface, said apparatus comprising a substantially circular magnetic field source for establishing said magnetic field (a) substantially parallel to at least a portion of said sputtering surface and (b) at an acute angle $\alpha$ of at least $\pm 3°$ with respect to a radial extending from the center of the circular magnetic field source so that said angle is in a plane which is substantially parallel to said portion of the sputtering surface.

2. Apparatus as in claim 1 where, $\alpha$ is $\pm 3°$ to $\pm 80°$.

3. Apparatus as in claim 2 where $\alpha$ equals $\pm 5°$ to $\pm 30°$.

4. Apparatus as in claim 1 where the entirety of said closed loop plasma path is formed adjacent said layer of target material.

5. Apparatus as in claim 1 where said layer of target material is substantially planar.

6. Apparatus as in claim 1 where said magnetic field source is disposed on the side of said target opposite the sputtering surface thereof.

7. Apparatus as in claim 1 where said magnetic field sources includes means for directly generating said magnetic field as a resultant magnetic field.

8. Apparatus as in claim 1 where said magnetic field source includes a plurality of flexible magnet strips wound in spiral configuration around one another.

9. Apparatus as in claim 8 where the inner end of each flexible magnet strip is provided with a taper of $\alpha°$.

10. Apparatus as in claim 9 where the inner end of each strip is attached to a centrally disposed supporting means.

11. Apparatus as in claim 8 where said spiral configuration is generally circular.

12. Apparatus as in claim 8 where said flexible magnet strips spiral inwardly toward said center of the magnetic field source.

13. Apparatus as in claim 12 where said magnetic field source includes a further plurality of flexible magnet strips disposed outside said first mentioned plurality of strips, said further plurality of strips being wound around one another away from said center of the source.

14. Apparatus as in claim 8 where said plurality of strips spiral outwardly from said center of the magnetic field source.

15. Apparatus as in claim 8 where said magnetic field source includes a further magnet means which encircles said plurality of flexible magnet strips, the direction of the flux in said further magnet means being substantially perpendicular to a plane containing at least a portion of the sputtering surface of said target material.

16. Apparatus as in claim 8 where at least a portion of the spiral configuration is disposed on the side of the target material opposite said sputtering surface in a plane substantially parallel to said portion of the sputtering surface.

17. Apparatus as in claim 1 where said magnetic field source includes means for generating said magnetic field as a resultant of two separate magnetic fields.

18. Apparatus as in claim 17 where at least some of the flux in said magnetic field source is parallel to said portion of the sputtering surface.

19. Apparatus as in claim 17 where said magnetic field source includes first magnet means for generating the first of said two separate magnetic fields in a direction substantially parallel to said radial from the center of the magnetic field source.

20. Apparatus as in claim 19 where said magnetic field source includes second magnet means for generating the second of said separate magnetic fields in a direction substantially perpendicular to said raidal.

21. Apparatus as in claim 20 where said second magnet means includes a plurality of radially oriented magnets extending along radials from said center of the magnetic field source.

22. Apparatus as in claim 21 including a plurality of gaps respectively between said plurality of radially oriented magnets.

23. Apparatus as in claim 22 including a plurality of bucking magnets disposed within predetermined portions of at least some of said gaps, the direction of flux within said bucking magnets being substantially opposite to that in said radially oriented magnets.

24. Apparatus as in claim 23 where said bucking magnets are rectangular in configuration.

25. Apparatus as in claim 23 where said bucking magnets are triangular in configuration.

26. Apparatus as in claim 23 where said first magnet means is disposed beneath said second magnet means and where said first and second magnet means are disposed beneath said target material.

27. Apparatus as in claim 26 where said magnetic field source includes a ring magnet which encircles said first and second magnet means, the flux direction in said ring magnet being substantially perpendicular to a plane containing at least a portion of the sputtering surface of said target material.

28. Apparatus as in claim 23 where said second magnet means includes a further plurality of radially oriented magnets respectively aligned with said first mentioned plurality of radially oriented magnets, the direction of the flux in said further plurality of radially oriented magnets being opposite that of the flux in the first mentioned plurality of radially oriented magnets.

29. Apparatus as in claim 28 where said second magnet means includes a further plurality of gaps respectively between said further plurality of radially oriented magnets.

30. Apparatus as in claim 29 including a further plurality of bucking magnets respectively disposed in predetermined portions of said further plurality of gaps, the direction of the flux in said further plurality of bucking magnets being opposite to that in said further plurality of radially oriented magnets.

31. A method of establishing the magnetic field in a magnetically enhanced sputter device wherein at least a portion of a closed loop plasma path is formed adjacent a layer of target material having a sputtering surface, said method comprising the steps of
establishing with a circular magnetic field source a first component of said magnetic field substantially parallel to a radial extending from the center of the circular magnetic field source; and
establishing with said circular magnetic field source a second component of said magnetic field substantially perpendicular to the radial so that the resultant of said first and second components is parallel to at least a portion of said sputtering surface and is at an acute angle of at least ±3° with respect to said first component of the magnetic field where said angle is in a plane which is substantially parallel to said portion of the sputtering surface.

32. A method as in claim 31 where the magnetic field is disposed at an angle of ±3° to ±80° with respect to said first component of the magnetic field.

33. A method as in claim 32 where said angle is ±5° to ±30°.

34. A method as in claim 31 where the entirety of said closed loop plasma path is formed adjacent said layer of target material.

35. A method as in claim 31 where said layer of target material is substantially planar.

36. A method as in claim 31 where said magnetic field is directly established as a resultant magnetic field and said first and second components thereof are established due to the establishment of the magnetic field.

37. A method as in claim 31 where said first and second components are respectively directly established and said magnetic field is established as the resultant thereof.

38. A magnetically enhanced sputter device wherein at least a portion of a closed loop plasma path is formed adjacent a layer of target material having a sputtering surface, said apparatus comprising an oblong-shaped planar magnetic field source having a plane of substantial symmetry extending along the length thereof and substantially perpendicular to the plane of said magnetic field source for establishing said magnetic field (a) substantially parallel to at least a portion of said sputtering surface and (b) at an acute angle $\alpha$ of at least ±3° with respect to a line substantially perpendicular to said plane of symmetry so that said angle is in a plane which is substantially parallel to said portion of the sputtering surface.

39. Apparatus as in claim 38 where, $\alpha$ is ±3° to ±80°.

40. Apparatus as in claim 39 where $\alpha$ equals ±5° to ±30°.

41. Apparatus as in claim 38 where the entirety of said plasma path is formed adjacent said layer of target material.

42. Apparatus as in claim 38 where said layer of target material is substantially planar.

43. Apparatus as in claim 38 where said magnetic field source is disposed on the side of said target opposite the sputtering surface thereof.

44. Apparatus as in claim 38 where said magnetic field source includes means for directly generating said magnetic field as a resultant magnetic field.

45. Apparatus as in claim 38 where said magnetic field source includes a plurality of flexible magnet strips wound in spiral configuration around one another.

46. Apparatus as in claim 45 where the inner end of each flexible magnet strip is provided with a taper of $\alpha°$.

47. Apparatus as in claim 46 where the inner end of each strip is attached to a centrally disposed supporting means.

48. Apparatus as in claim 45 where said spiral configuration is generally oval.

49. Apparatus as in claim 45 where said flexible magnet strips spiral inwardly toward a central location within said magnetic field source.

50. Apparatus as in claim 49 where said magnetic field source includes a further plurality of flexible magnet strips disposed outside said first mentioned plurality of strips, said further plurality of strips being wound around one another away from said central location.

51. Apparatus as in claim 45 where said plurality of strips spiral outwardly from a central location within said magnetic field source.

52. Apparatus as in claim 45 where said magnetic field source includes a further magnet means which encircles said plurality of flexible magnet strips, the direction of the flux in said further magnet means being substantially perpendicular to a plane containing at least a portion of the sputtering surface of said target material.

53. Apparatus as in claim 45 where at least a portion of the spiral configuration is disposed on the side of the target material opposite said sputtering surface in a plane substantially parallel to said portion of the sputtering surface.

54. Apparatus as in claim 38 where said magnetic field source includes means for generating said magnetic field as a resultant of two separate magnetic fields.

55. Apparatus as in claim 54 where said magnetic field source includes first magnet means for generating the first of said two separate magnetic fields in a direction substantially parallel to said line perpendicular to the plane of symmetry.

56. Apparatus as in claim 55 where said magnetic field source includes second magnet means for generating the second of said separate magnetic fields in a direction substantially perpendicular to the line perpendicular to the plane of symmetry.

57. Apparatus as in claim 56 where said second magnet means includes a plurality of radially oriented magnets extending along radials from a central location within said magnetic field source.

58. Apparatus as in claim 57 including a plurality of gaps respectively between said plurality of radially oriented magnets.

59. Apparatus as in claim 58 including a plurality of bucking magnets disposed within predetermined portions of at least some of said gaps, the direction of flux within said bucking magnets being substantially opposite to that in said radially oriented magnets.

60. Apparatus as in claim 59 where said bucking magnets are rectangular in configuration.

61. Apparatus as in claim 59 where said bucking magnets are triangular in configuration.

62. Apparatus as in claim 59 where said first magnet means is disposed beneath said second magnet means and where said first and second magnet means are disposed beneath said target material.

63. Apparatus as in claim 62 where said magnetic field source includes a ring magnet which encircles said first and second magnet means, the flux direction in said ring magnet being substantially perpendicular to a plane containing at least a portion of the sputtering surface of said target material.

64. Apparatus as in claim 59 where said second magnet means includes a further plurality of radially oriented magnets respectively aligned with said first mentioned plurality of radially oriented magnets, the direction of the flux in said further plurality of radially oriented magnets being opposite that of the flux in the first mentioned plurality of radially oriented magnets.

65. Apparatus as in claim 64 where said second magnet means includes a further plurality of gaps respectively between said further plurality of radially oriented magnets.

66. Apparatus as in claim 65 including a further plurality of bucking magnets respectively disposed in a predetermined portions of said further plurality of gaps, the direction of the flux in said further plurality of bucking magnets being opposite to that in said further plurality of radially oriented magnets.

67. Apparatus as in claim 54 where at least some of the flux in said magnetic field source is parallel to said portion of the sputtering surface.

68. A method of establishing the magnetic field in a magnetically enhanced sputter device wherein at least a portion of a closed loop plasma path is formed adjacent a layer of target material having a sputtering surface, said method comprising the steps of establishing with an oblong-shaped, planar magnetic field source having a plane of substantial symmetry extending along the length thereof and substantially perpendicular to the plane of said magnetic field source, a first component of said magnetic field substantially parallel to a line substantially perpendicular to said plane of symmetry; and establishing a second component of said magnetic field substantially perpendicular to said line so that the resultant of said first and second components is parallel to at least a portion of said sputtering surface and is at an angle of at least ±3° with respect to said first component of the magnetic field where said angle is in a plane which is substantially parallel to said portion of the sputtering surface.

69. A method as in claim 68 where the magnetic field is disposed at an angle of ±3° to ±80° with respect to said first component of the magnetic field.

70. A method as in claim 69 where said angle is ±5° to ±30°.

71. A method as in claim 68 where the entirety of said closed loop plasma path is formed adjacent said layer of target material.

72. A method as in claim 68 where said layer of target material is substantially planar.

73. A method as in claim 68 where said magnetic field is directly established as a resultant magnetic field and said first and second components thereof are established due to the establishment of the magnetic field.

74. A method as in claim 68 where said first and second components are respectively directly established and said magnetic field is established as the resultant thereof.

* * * * *